(12) United States Patent
Belfiore

(10) Patent No.: US 11,269,051 B2
(45) Date of Patent: Mar. 8, 2022

(54) CIRCUIT, CORRESPONDING FREQUENCY MULTIPLIER ARRANGEMENT, SYSTEM, VEHICLE AND METHOD

(71) Applicant: STMicroelectronics S.r.l., Agrate Brianza (IT)

(72) Inventor: Francesco Belfiore, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 249 days.

(21) Appl. No.: 16/707,021

(22) Filed: Dec. 9, 2019

(65) Prior Publication Data
US 2020/0200867 A1 Jun. 25, 2020

(30) Foreign Application Priority Data

Dec. 20, 2018 (IT) .......................... 102018000020371

(51) Int. Cl.
*G01S 7/03* (2006.01)
*G01S 13/931* (2020.01)
(Continued)

(52) U.S. Cl.
CPC ............ *G01S 7/032* (2013.01); *G01S 13/931* (2013.01); *H03K 5/00006* (2013.01); *G08G 1/166* (2013.01)

(58) Field of Classification Search
CPC ........ G01S 7/032; G01S 7/285; G01S 13/931; H03K 5/00006; G08G 1/166
See application file for complete search history.

(56) References Cited

U.S. PATENT DOCUMENTS 3,903,525 A * 9/1975 Mullins ............... G01S 13/5242
342/161
3,922,593 A * 11/1975 McGuffin ........... H03K 5/00006
327/116

(Continued)

FOREIGN PATENT DOCUMENTS

CN 102104363 B 1/2013

OTHER PUBLICATIONS

Daquan Huang et al "Terahertz CMOS Frequency Generator Using Linear Superposition Tecnique", IEEE Journal of Solid-State Circuits, IEEE Sevice Center, Piscataway, NJ, USA, vol. 43, No. 12, Dec. 1, 2008 (Dec. 1, 2008), pp. 2730-2738, XP011238652.

(Continued)

*Primary Examiner* — Peter M Bythrow
(74) *Attorney, Agent, or Firm* — Crowe & Dunlevy

(57) ABSTRACT

A circuit includes an input port receiving an input signal having a first frequency. A phase-shifter network is coupled to the input port, receives the input signal, and produces therefrom first and second signals in quadrature with one another. Frequency multiplier circuitry has a common node and includes a first rectifier for rectifying the first signal to produce a first rectified signal having a second frequency that is twice the first frequency and to be applied to the common node, and a second rectifier rectifying the second signal to produce a second rectified signal having the second frequency and to be applied to the common node. A combination of the first and second rectified signals is available at the common node and includes harmonic contents at a frequency that is fourfold the first frequency.

17 Claims, 9 Drawing Sheets

(51) Int. Cl.
H03K 5/00 (2006.01)
G08G 1/16 (2006.01)

(56) References Cited

U.S. PATENT DOCUMENTS

| | | | | |
|---|---|---|---|---|
| 3,952,302 | A * | 4/1976 | Mullins | G01S 13/5242 |
| | | | | 342/161 |
| 4,101,888 | A * | 7/1978 | Heller | G01S 13/931 |
| | | | | 342/111 |
| 4,217,585 | A * | 8/1980 | Fishbein | G01S 13/536 |
| | | | | 342/160 |
| 7,215,167 | B1 * | 5/2007 | Hassun | H03L 7/16 |
| | | | | 327/158 |
| 2003/0017812 | A1 * | 1/2003 | Arimura | H03B 19/14 |
| | | | | 455/112 |
| 2004/0160248 | A1 * | 8/2004 | Streit | H03B 28/00 |
| | | | | 327/129 |
| 2004/0257129 | A1 * | 12/2004 | Kwok | H03D 7/1491 |
| | | | | 327/116 |
| 2004/0257152 | A1 * | 12/2004 | Kwok | H03B 27/00 |
| | | | | 327/552 |
| 2010/0109724 | A1 * | 5/2010 | Huang | H03B 5/1293 |
| | | | | 327/156 |
| 2015/0295497 | A1 * | 10/2015 | Perreault | H02M 7/217 |
| | | | | 363/21.03 |
| 2017/0288607 | A1 * | 10/2017 | Alijabbari | H03D 7/166 |
| 2020/0200867 | A1 * | 6/2020 | Belfiore | G01S 7/032 |

OTHER PUBLICATIONS

IT Search Report and Written Opinion for IT Appl. No. 102018000020371 dated Aug. 26, 2019 (10 pages).
Yo Yamaguchi, et al: "A Highly Integrated X-band Frequency Quadrupler MMIC using 3D-MMIC Technology," 2007 IEEE, Radio Frequency Integrated Circuits Symposium, pp. 757-760.
Hans Peter Forstner et al: "Frequency Quadruplets for a 77GHz Subharmonically Pumped Automotive Radar Transceiver in SiGe," Microwave Integrated Circuits Conference. 2009. Sep. 28, 2009, pp. 188-191, XP031551249.

* cited by examiner

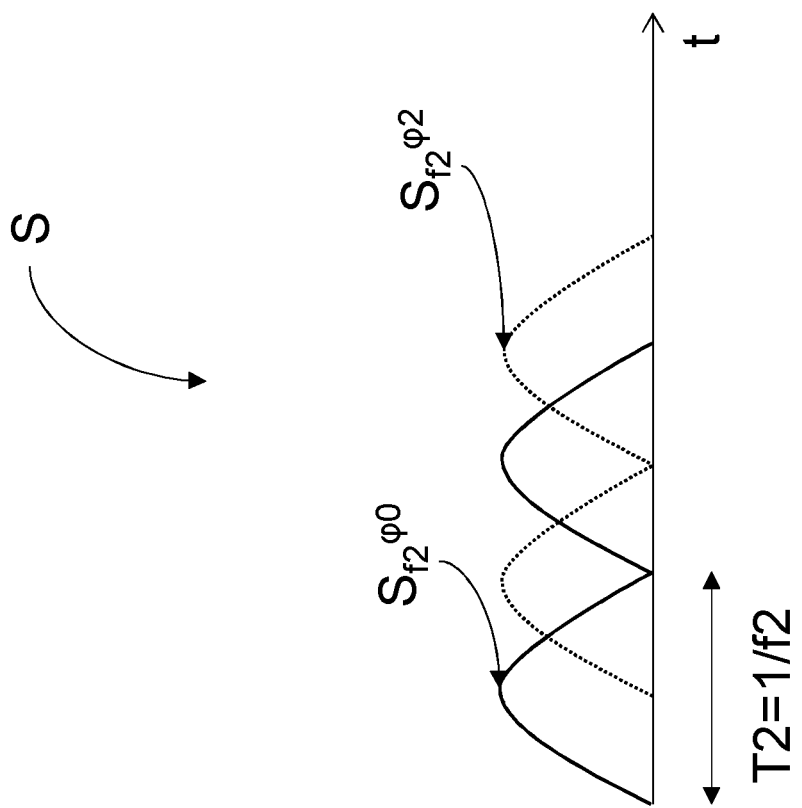

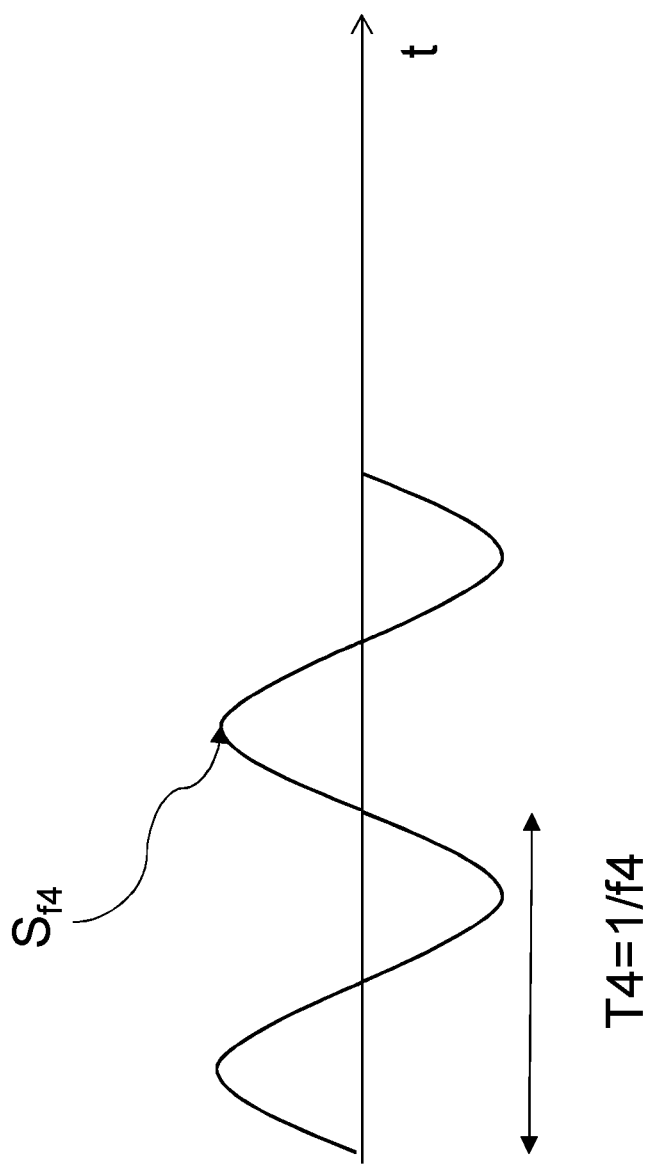

CIRCUIT, CORRESPONDING FREQUENCY MULTIPLIER ARRANGEMENT, SYSTEM, VEHICLE AND METHOD

PRIORITY CLAIM

This application claims the priority benefit of Italian Application for Patent No. 102018000020371, filed on Dec. 20, 2018, the content of which is hereby incorporated by reference in its entirety to the maximum extent allowable by law.

TECHNICAL FIELD

The description relates to generating high frequency signals. One or more embodiments may relate to frequency multipliers using solid-state components, for instance in millimeter wave, briefly mmW, broad-band frequency multipliers. One or more embodiments may relate to a pedestrian crossing detection system and/or integrated circuit, for instance mmW transceivers in automotive and/or consumer applications.

BACKGROUND

Frequency multipliers are commonly used for generating high-frequency signals. Frequency doublers, referred to as "doublers", are a common type of frequency multiplier, producing an output signal at twice the frequency of the input signal. Frequency doubling architectures are useful to generate high frequency signals and may be employed in the design of frequency quadrupler architectures which provide an output signal having four times the input frequency, e.g., for RF and mmW applications. Conventionally, frequency quadruplication may be performed by a cascade of frequency doubling stages, as exemplified in FIG. 1.

A conventional frequency quadruplication system 100 as exemplified in FIG. 1 may comprise:
 an input node, $f_i$, configured to receive a signal from an oscillator at a given frequency,
 a sequence of amplification stages, 110a, 110b, 110c,
 a cascade of frequency doubling stages 120a, 120b, configured for providing a doubled-frequency signal $f_d$,
 a high frequency filter 130, e.g., a mmW filter,
 an output node, $f_q$, configured to provide a signal having the power of the input signal with a frequency four times the input signal frequency.

In the following, for the sake of brevity, like references may be used to indicate both nodes and/or signals at such nodes.

This solution may generate lot of spurious undesired harmonic components, leading to degradation of the overall performance of the frequency multiplication system 100. Moreover, several amplifiers 110a, 110b, 110c are present in order to recover the signal power level, as well as the high frequency filter 130 to eliminate (or reduce) spurious harmonics from the output of the first doubler 120a.

In general, extending doubling stages to work with high frequency signals may be challenging, as it may involve complex circuits designed to filter undesired harmonic components, e.g., signals having a frequency with a higher multiple than twice the input frequency.

Consequently, conventional high-order frequency multiplier systems 100 as exemplified in FIG. 1 may comprise cascaded chains of doublers 120a, 120b, with intermediate "matching" stages 130 designed to match the impedance seen by preceding stages, as unwanted reflections at these intermediate stages 130 can detrimentally affect the performance of the multiplier 120a driving other multipliers 120b, reducing efficiency and bandwidth.

The overall efficiency of the chain 100 may be reduced and may increase demand on the power handling of earlier stages as the entire chain 100, often driven with higher levels of power to achieve a given, target output power.

Documents exemplary of such an activity in the field may be:
 Y. Wang, et al.: "A 9% power efficiency 121-to-137 GHz phase-controlled push-push frequency quadrupler in 0.13 µm SiGe BiCMOS", 2012, IEEE International Solid-State Circuits Conference, San Francisco, Calif., 2012, pp. 262-264. doi: 10.1109/ISSCC.2012.6177008 (incorporated by reference), which discusses enhancing a frequency quadrupler core using a phase-controlled push-push (PCPP) technique to directly synthesize the $4^{th}$ harmonic. The document discusses a 121-to-137 GHz frequency quadrupler based on a 0.13 µm SiGe BiCMOS process. The DC power consumptions of the quadrupler core and input buffers discussed are 6.4 mW and 28.8 mW, respectively;
 United Stated Patent Application Publication No. 2017/0288607 A1 (incorporated by reference) which discusses an integrated frequency quadruplet comprised of a pair of balanced frequency doublers that are driven in phase quadrature using a hybrid coupler, which may result effectively in a "unilateral" multiplier that presents a match to the input-driving source, irrespective of the impedance of doubler stages. The document discusses an architecture to implement an integrated frequency quadruplet with output frequency of 160 GHz using quasi-vertical GaAs varactors fabricated on thin silicon support membranes. The quadruplet discussed in the document has a balanced circuit architecture that addresses degradation issues often arising from impedance mismatches between multiplier stages, a unique quasi-vertical diode process resulting in an integrated drop-in chip module that incorporates 18 varactors, matching networks and beam-leads for mounting a chip tailored to fit a multiplier waveguide housing resulting in high reproducibility and consistency in manufacture and performance.

As mentioned, known solutions may present one or more of the following drawbacks:
 a high architectural complexity;
 the employment of high-complexity components, e.g., Class-C and Class-AB drivers;
 adequate, e.g., high, levels of supply voltage; and
 the generation of spurious harmonics.

SUMMARY

An object of one or more embodiments is to contribute in providing improvements and enhancements over the conventional techniques described above.

According to one or more embodiments, this object can be achieved by a method having the features set forth in the claims that follow.

A frequency multiplication method may be exemplary of such a method.

One or more embodiments may relate to a corresponding circuit (e.g., an integrated circuit for use in implementing the method according to embodiments).

One or more embodiments may relate to a corresponding circuit (e.g., a radar sensor).

One or more embodiments may relate to a corresponding vehicle (e.g., a motor car equipped with a circuit according to embodiments).

The claims are an integral part of the technical teaching provided herein with reference to the embodiments.

One or more embodiments may be developed by paying attention to the possible use to provide millimeter wavelength signals, briefly mmW signals.

One or more embodiments are however applicable to virtually any possible range of operating frequencies.

One or more embodiments may be developed by paying attention to the possible use to frequency multipliers providing a multiplication coefficient of four times the input signal.

One or more embodiments are however applicable to virtually any possible multiplication coefficient.

One or more embodiments may use a pair of dual balanced frequency doublers driven in quadrature, e.g., by a same input signal split into two by a 90° phase shifter.

One or more embodiments may employ a single balanced doubler.

One or more embodiments may advantageously:
involve low supply voltages;
provide a signal with broad band characteristics, e.g., thanks to a single balanced doubler;
provide a compact architecture, facilitating suppression of the undesired fundamental frequency and doubled frequency harmonic components in the output, providing solely the desired quadrupled frequency signal;
generate a sinusoidal signal;
avoid cascading doublers that generate more spurious harmonics in the system, which in turn use dedicated filters to suppress those spurious harmonics.

One or more embodiments may advantageously provide a compact device.

One or more embodiments may advantageously facilitate improving the performance of radio-frequency components, e.g., for broad-band application.

BRIEF DESCRIPTION OF THE DRAWINGS

One or more embodiments will now be described, by way of non-limiting example only, with reference to the annexed Figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The references used herein are provided merely for convenience and hence do not define the extent of protection or the scope of the embodiments.

Throughout the instant description, ordinal numbers (e.g. first, second, third, . . . ) will be used with the purpose of facilitating the identification of components. It will be otherwise appreciated that such ordinal numbers are merely intended for that purpose and shall not be construed, even indirectly, in a limiting sense of the embodiments.

Figure 1:
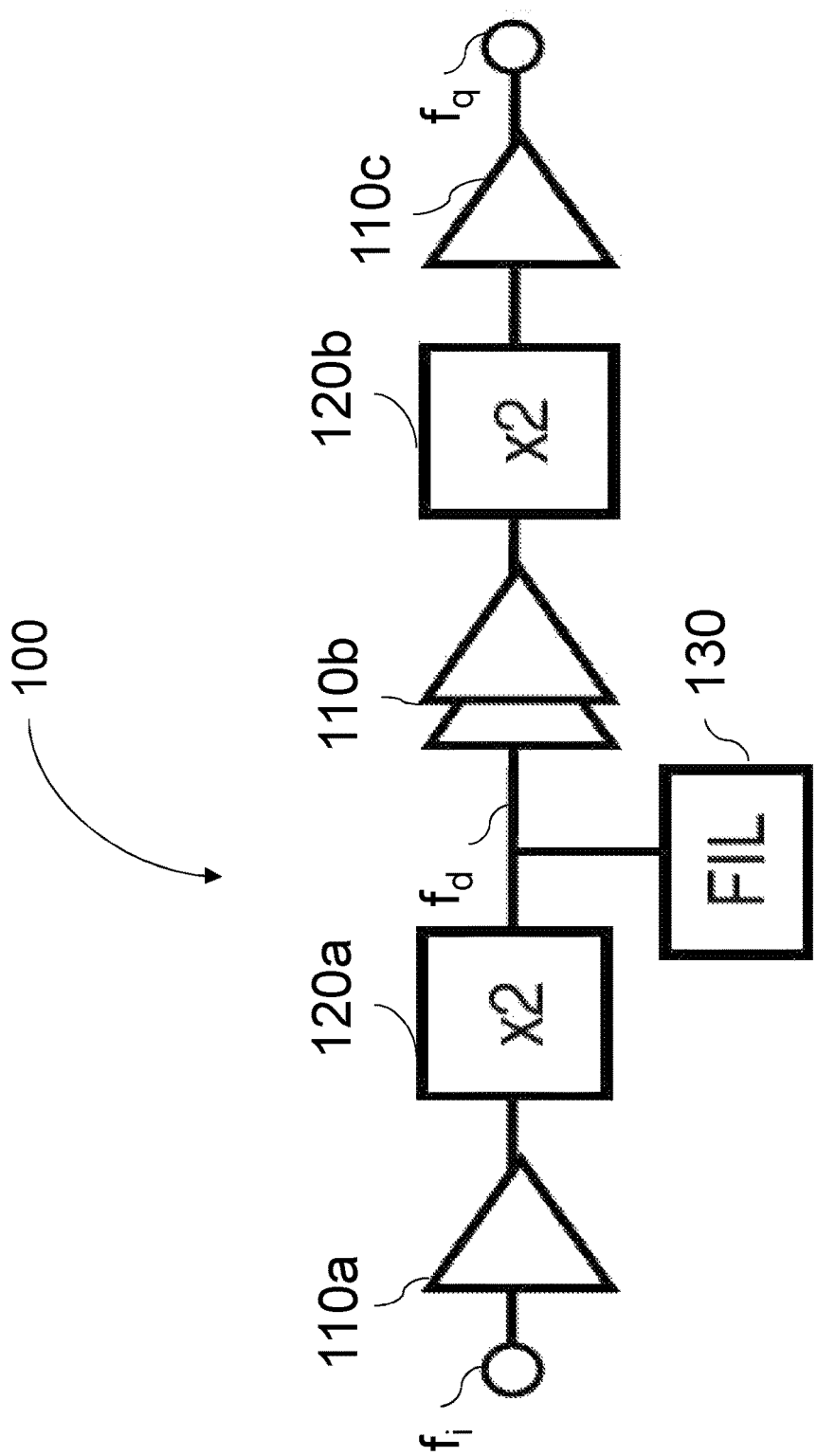
FIG. 1 is a block diagram of a conventional frequency quadruplication process.
Figure 2:
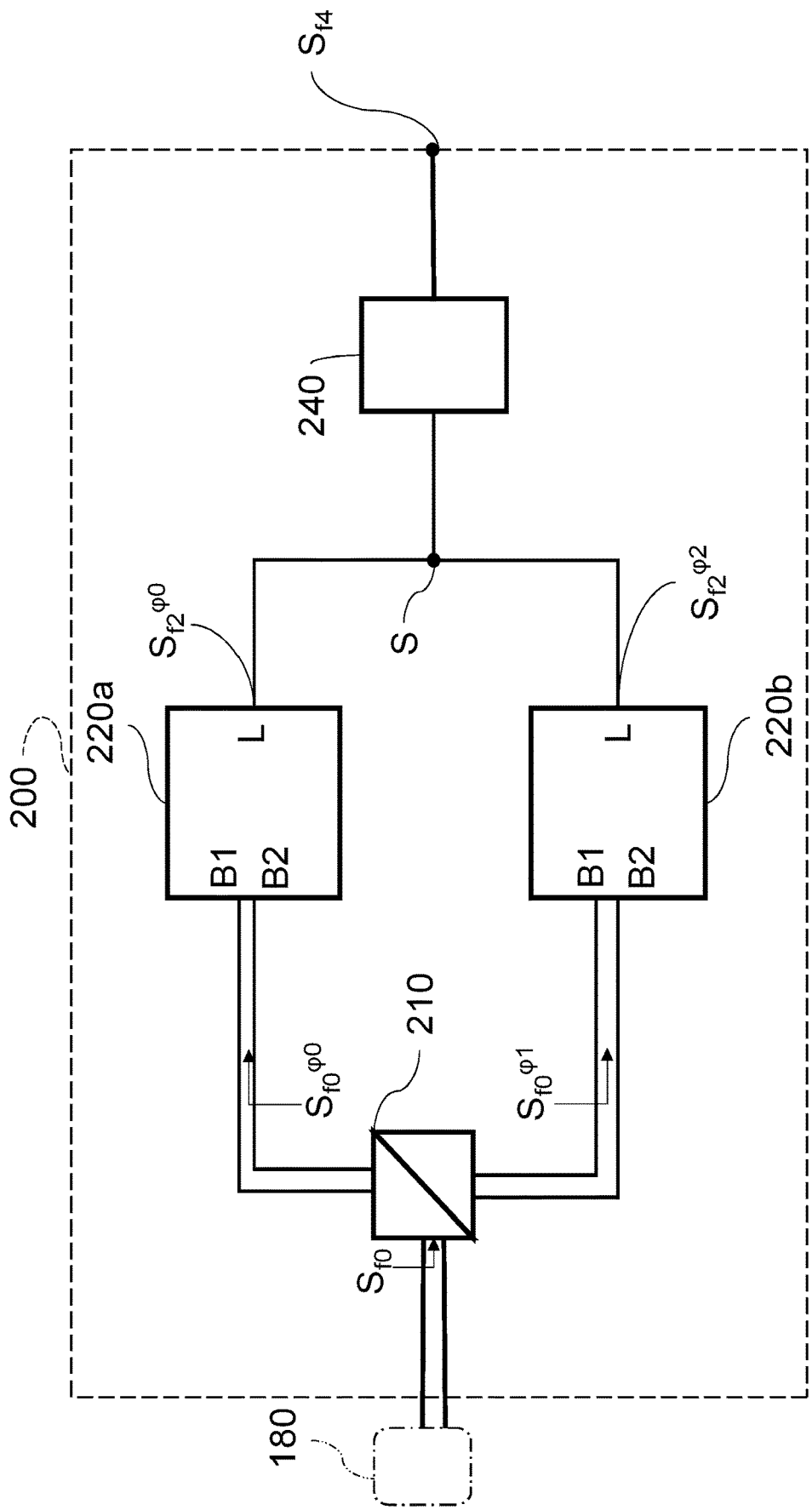
FIG. 2 is exemplary of one or more embodiments of a circuit according to the present disclosure.

By way of introduction to a detailed description of exemplary embodiments, reference may be first had to FIG. 2.

For the sake of brevity, like references may be used in the following to indicate ports or nodes and signals at such ports or nodes.

It is noted that, for the sake of simplicity, principled underlying embodiments are discussed in the following with respect to a circuit arrangement to provide an output signal having a multiplication factor N=4 (an output signal having a frequency four times the frequency of the input signal), being otherwise understood that such a figure number is purely exemplary and should not be construed as limiting.

In one or more embodiments, a frequency multiplier 200, as exemplified in FIG. 2, may comprise:
an oscillator 180, configured to generate a periodic input signal $S_{f0}$,
an input port $S_{f0}$, configured to receive the input signal $S_{f0}$ having a known frequency and phase. For instance, such input signal $S_{f0}$ may be a sinusoidal signal having an input frequency value f0 and an input phase value $\varphi 0$ and which may be expressed as, e.g., $S_{f0}$=sin$(2*\pi*f0*t+\varphi 0)$;
a phase shifter network 210, e.g., a three-port network, coupled to the input port $S_{f0}$ and configured to receive the input signal $S_{f0}$ and to provide a set of out-of-phase signals $S_{f0}^{\varphi 0}$, $S_{f0}^{\varphi 1}$ at respective output ports, the out-of-phase signals $S_{f0}^{\varphi 0}$, $S_{f0}^{\varphi 1}$ having a like frequency f0, e.g., the input signal frequency, and phases $\varphi 0$, $\varphi 1$ different by 90° or $\pi/2$ radians, e.g. $\varphi 1=\varphi 0+\pi/2$;
a set of frequency doublers 220a, 220b, coupled to respective output ports of the phase shifter network 210, which may be configured to receive and rectify the set of out-of-phase signals $S_{f0}^{\varphi 0}$, $S_{f0}^{\varphi 0}$ and to provide a set of rectified signals $S_{f2}^{\varphi 0}$, $S_{f2}^{\varphi 2}$,
a common node S, e.g. a superposition node S, the common node S configured to receive and combine the set of rectified signals $S_{f2}^{\varphi 0}$, $S_{f2}^{\varphi 2}$, providing a combined signal S having a harmonic component $S_{f4}$ at a frequency a multiplication factor N times the frequency of the input signal, e.g., N=4, for instance as a result of the combination S, e.g., sum or superposition, of signals in the set of rectified signals $S_{f2}^{\varphi 0}$, $S_{f2}^{\varphi 2}$, and processing circuitry 240, e.g., a capacitive DC-decoupling circuitry, coupled to the common node S, configured to remove a DC component from the combined signal S, e.g., centering its mean value onto zero.

Such architecture 200 may be found suitable in generating mmW signals, e.g., facilitating the increase of production margins of oscillators, e.g., voltage controlled oscillators briefly VCO.

In one or more embodiments, the set of out-of-phase signals $S_{f0}^{\varphi 0}$, $S_{f0}^{\varphi 1}$ provided by the phase shifter network 210 may comprise:
- a first signal $S_{f0}^{\varphi 0}$, substantially a copy of the input signal $S_{f0}^{\varphi 0}$, which may be expressed as: $S_{f0}^{\varphi 0}=\sin(2*\pi*f0*t+\varphi 0)$; and
- a second signal $S_{f0}^{\varphi 0}$, having a second phase $\varphi 1$ different from the first phase $\varphi 0$, which may be in quadrature with the input signal $S_{f0}$, e.g., out of phase of 90° with respect to the phase of the input signal and/or of the phase $\varphi 0$ of the first signal $S_{f0}^{\varphi 0}$, which may be expressed as: $S_{f0}^{\varphi 1}=\sin(2*\pi*f0*t+\varphi 1)=\sin(2*\pi*f0*t+\varphi 0+\pi*0.5)$.

In one or more embodiments, the phase shifter network 210 may be configured to receive the input signal $S_{f0}$ as provided via a transmission line and to provide the out of phase signals to the doubler stages 220a, 220b via transmission lines coupled at respective network output ports, e.g., in a three-ports network 210.

For instance, the phase shifter network 210 may comprise a network of passive components, e.g., resistors and capacitors RC, or through transmission lines specifically for high frequency.

Figure 2A:
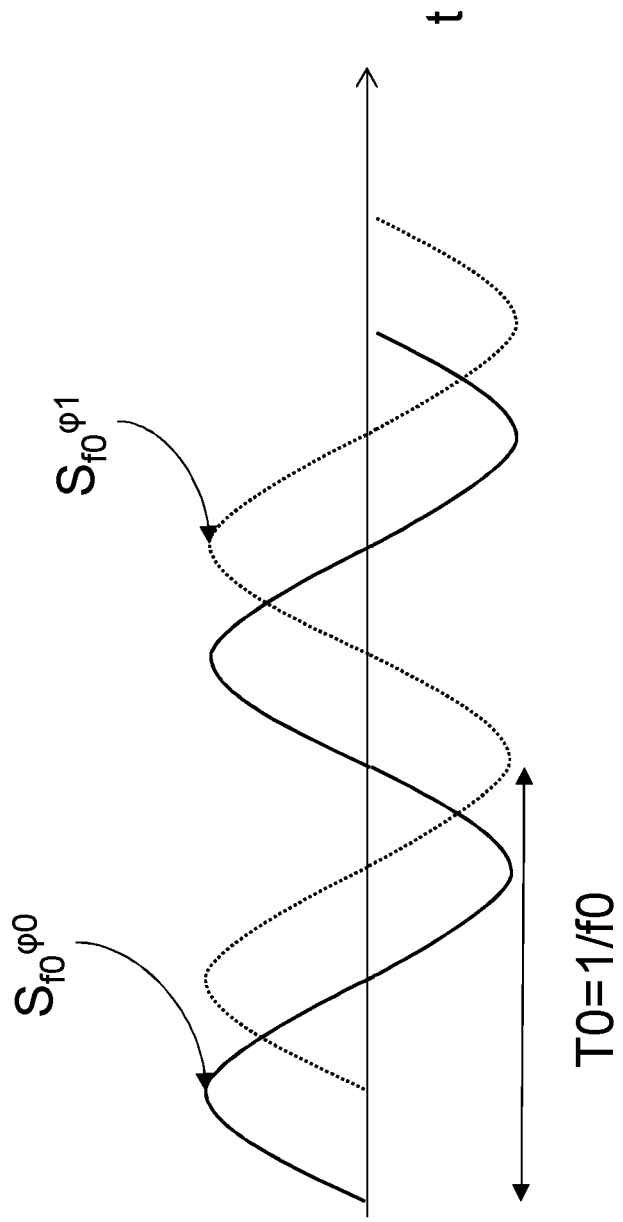
FIG. 2A is a diagram exemplary of one or more embodiments of signals in a portion of the circuit of FIG. 2.

FIG. 2A shows an exemplary time diagram of the set of out-of-phase signals $S_{f0}^{\varphi 0}$, $S_{f0}^{\varphi 1}$ having period T0=1/f0 and in quadrature therebetween, e.g., the second signal $S_{f0}^{\varphi 0}$ in quadrature with the first signal $S_{f0}^{\varphi 0}$.

In one or more embodiments, the set of frequency doublers 220a, 220b in the circuit arrangement 200, may comprise:
- a first frequency doubler 220a, configured to receive the first signal $S_{f0}^{\varphi 0}$ and to provide as output a first rectified signal $S_{f2}^{\varphi 0}$ in the set rectified signals $S_{f2}^{\varphi 0}$, $S_{f2}^{\varphi 2}$, and
- a second frequency doubler 220b, configured to receive the second signal $S_{f0}^{\varphi 1}$ and to provide as output a second rectified signal $S_{f2}^{\varphi 0}$ in the set rectified signals $S_{f2}^{\varphi 0}$, $S_{f2}^{\varphi 2}$.

Figure 3:
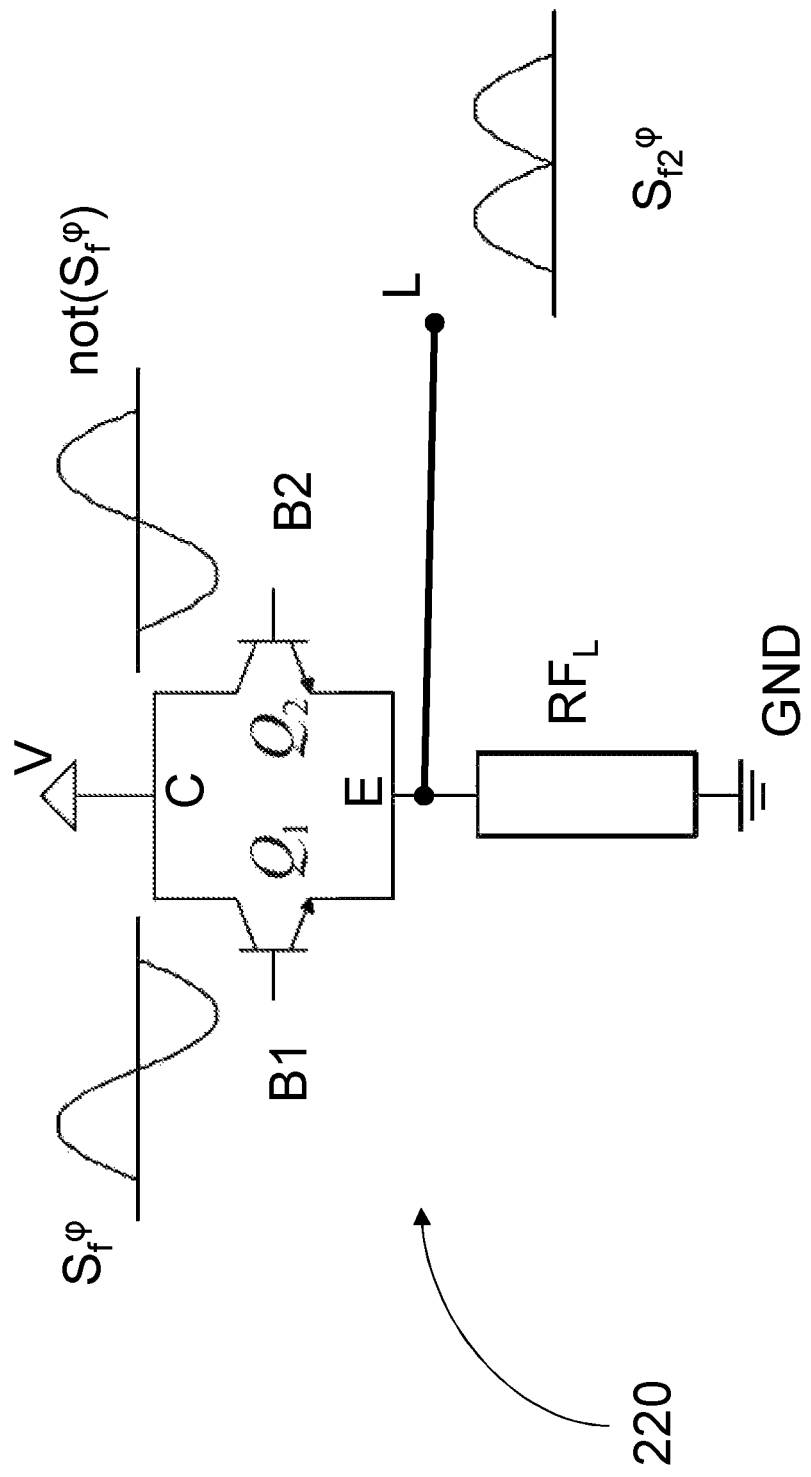
FIG. 3 is exemplary of one or more embodiments of a portion of the circuit of FIG. 2, FIGS. 3A and 4 are exemplary of diagrams of signals in the circuits of FIG. 2 and FIG. 3.

In one or more embodiments, the first 220a and second 220b frequency doublers may comprise a like frequency doubler arrangement 220, as discussed in the foregoing with respect to FIG. 3.

On one or more embodiments, the set of frequency doublers 220a, 220b may comprise a dual balanced frequency doubler architecture 200, for instance based on a single balanced doubler, as discussed in the following.

FIG. 3 is exemplary of embodiments of the frequency doubler arrangement 220 which may be employed in the set of frequency doublers 220a, 220b in the circuit 200.

In one or more embodiments, the frequency doubler arrangement 220 may be used to double effectively the input signal frequency value f0.

In one or more embodiments as exemplified in FIGS. 2 and 3, the frequency doubler arrangement 220 may comprise:
- a first input node B1, configured to receive a first wave signal $S_f^{\varphi}$, e.g., the first wave signal may be expressed as: $S_f^{\varphi}=\sin(2*\pi*f*t+\varphi)$, and
- a second input node B2, configured to receive a second wave signal $\text{not}(S_f^{\varphi})$ in antiphase with the first wave signal, e.g., the second wave signal $\text{not}(S_f^{\varphi})$ may be expressed as $\text{not}(S_f^{\varphi})=(-1)*\sin(2*\pi*f*t+\varphi)$,
- an output node L, configured to provide as output a rectified frequency doubled signal $S_{f2}^{\varphi}$, and
- a ground node GND and a voltage supply node V.

In one or more embodiments, the first and second wave signals $S_f^{\varphi}$, $\text{not}(S_f^{\varphi})$ may be received from respective parallel lines in the transmission line coupling the phase-shifter network 210 with the set of frequency doublers 220a, 220b.

In one or more embodiments, the doubler arrangement 220 may comprise an inverter (not visible) coupled at the second input node, configured to generate the second wave signal $\text{not}(S_f^{\varphi})$ in antiphase with the first wave signal.

In one or more embodiments, the phase-shifter network 210 comprises a differential network configured to provide to respective first and second multipliers 220a, 220b the first signal $S_{f0}^{\varphi 0}$ and said second signal $S_{f0}^{\varphi 1}$ as a pair of signal replicas $S_f^{\varphi}$, $\text{not}(S_f^{\varphi})$ in anti-phase therebetween.

In one or more embodiments, the first input node B1 and the second input node B2 may be coupled to respective control terminals of a balanced pair of transistors $Q_1$, $Q_2$ in the frequency doubler arrangement 220 in the set of frequency doublers 220a, 220b.

In one or more embodiments, the balanced pair of transistors $Q_1$, $Q_2$ may comprise bipolar transistors or MOSFET transistors.

For instance, the balanced pair of transistors $Q_1$, $Q_2$ may comprise:
- a first transistor $Q_1$, having a first input node B1, e.g., base terminal, coupled to the input node of the doubler arrangement 220, and
- a second transistor $Q_2$, having a second input node B2, e.g., base terminal, coupled to the input node of the doubler arrangement 220.

In one or more embodiments, the first $Q_1$ and second $Q_2$ transistor may have a first common terminal C, e.g., common collector, coupled to the voltage supply node V and a second common terminal, e.g., common emitter, forming a current path in the respective transistor $Q_1$, $Q_2$.

In one or more embodiments, a load $RF_L$, e.g., an impedance load, may be coupled between the second common node E and ground GND.

In one or more embodiments, the output node L of the doubler arrangement 220 may be configured to sense a rectified signal at the load $RF_L$, e.g., between the second common control terminal E and a terminal of the load $RF_L$.

In one or more embodiments, the doubler arrangement 220 may provide at the output node L, coupled to the common node S in respective first and second doubler arrangement 220a, 220b, a rectified signal $S_{f2}^{\varphi}$, e.g., full-wave rectified, sensed at the load $RF_L$ as a result of the switching of the two transistors $Q_1$ and $Q_2$ when the first $S_f^{\varphi}$ and second $\text{not}(S_f^{\varphi})$ input signals in anti-phase therebetween are received and/or applied at the first B1 and second B2 control terminals of the first $Q_1$ and second $Q_2$ transistors, respectively.

In an exemplary transistor switching operation, for instance:
- when the first transistor $Q_1$ receives a positive half-wave in the first input signal $S_f^{\varphi}$, the second transistor $Q_2$ receives a negative half-wave in the second input signal $\text{not}(S_f^{\varphi})$, hence the first transistor is switched on, providing the input signal half-wave to the load, where it is sensed, while the second transistor is switched off;
- when the first transistor $Q_1$ receives a negative half-wave in the first input signal $S_f^{\varphi}$, the second transistor $Q_2$ receives a positive half-wave in the second input signal not($S_f^\varphi$), hence the second transistor is switched on, providing the input signal half-wave to the load, where it is sensed, while the first transistor is switched off.

For instance, the full-wave rectifier 220 may convert the input waveforms $S_f^\varphi$, not($S_f^\varphi$) to a full-wave rectified signal $S_{f2}^\varphi$ at the node L coupled to the common node S in the circuit arrangement 200, and the signal $S_{f2}$ may have a constant polarity, e.g., positive or negative.

One or more embodiments of the frequency doubler arrangement 220 may have wide bandwidth and high conversion efficiency.

For instance, in the exemplary case of input signals $S_f^\varphi$, not($S_f^\varphi$) received at the respective transistor control terminals $Q_1$, $Q_2$ are sinusoidal signals having angular frequency $\Omega$, the full-wave rectified signal $S_{f2}^\varphi$ sensed at the output node L may have a plurality of harmonics contributions, as visible in the Fourier series x(t) which may be expressed as:

$$x(t) = \frac{2A}{\pi}\left(1 - \frac{2}{3}\cos(2\Omega t) - \frac{2}{15}\cos(2\Omega t) - \frac{2}{35}\cos(2\Omega t) - \ldots\right)$$

In one or more embodiments:
the first doubler 220a may provide a first full-wave rectified signal $S_{f2}^{\varphi 0}$, for instance having a phase value φ0 equal to the phase value of the first signal $S_{f0}^{\varphi 0}$, and
the second doubler 220b may provide a second full-wave rectified signal $S_{f2}^{\varphi 2}$, for instance having a phase value φ2 equal to double the phase value of the second signal $S_{f0}^{\varphi 2}$, e.g., shifted of 180° or π radians with respect to the first full-wave rectified signal $S_{f2}^{\varphi 0}$.

FIG. 3A is exemplary of time diagrams of the first full-wave rectified signal $S_{f2}^{\varphi 0}$, e.g., provided by the first frequency doubler 220a, and of the second full-wave rectified signal $S_{f2}^{\varphi 2}$, e.g., provided by the second frequency doubler 220b, having period T2=1/f2.

In one or more embodiments, as exemplified in FIG. 2, the common node S may receive the first $S_{f2}^{\varphi 0}$ and second $S_{f2}^{\varphi 2}$ full-wave rectified signals, e.g., the second rectified signal $S_{f2}^{\varphi 2}$ shifted (e.g., delayed or anticipated) of a half-period T2/2 time with respect to the first full-wave rectified signal $S_{f2}^{\varphi 0}$ (in other words, the second rectified signal $S_{f2}^{\varphi 2}$ phase-shifted of 180° with respect to the first full-wave rectified signal $S_{f2}^{\varphi 0}$).

In one or more embodiments, the common node S may be configured to combine the first $S_{f2}^{\varphi 0}$ and second $S_{f2}^{\varphi 2}$ rectified signals in the set of out-of-phase rectified signals $S_{f2}^{\varphi 0}$, $S_{f2}^{\varphi 2}$, e.g., by superposition.

In one or more embodiments, the common node S may be configured to generate a combined signal S, comprising harmonic contents as a result, e.g., of selecting a harmonics contribution $S_{f4}$ in the sum signal having a frequency value f4 fourfold the input frequency value f0 of the input signal $S_{f0}$.

For instance, in the example considered, in order to have a combination signal having harmonic content at the frequency value f4 corresponding to a wavelength λ4 lying in the millimeter wavelength range, for instance λ4=250 micron, then the input signal $S_{f0}$, for instance provided by the oscillator 180, may have a first frequency value f0 and corresponding wavelength λ0 designed accordingly, for instance λ0=1 millimeter (where wavelength λ and frequency f are related by the known formula λ=c/f, where c is the speed of light in the light propagation medium).

In one or more embodiments, the harmonic contents of the combined signal S may be filtered 240, e.g., a DC component may be removed by the capacitive processing circuitry 240.

FIG. 4 is an exemplary time diagram of one or more embodiments of the harmonic contents $S_{f4}$ as a result of signal combination S, proportional to the main harmonics contribution having a frequency f4 multiple of the input signal frequency f0, e.g., f4=4*f0. For instance, the combined signal S may have a period T4=1/f4.

Figure 5:
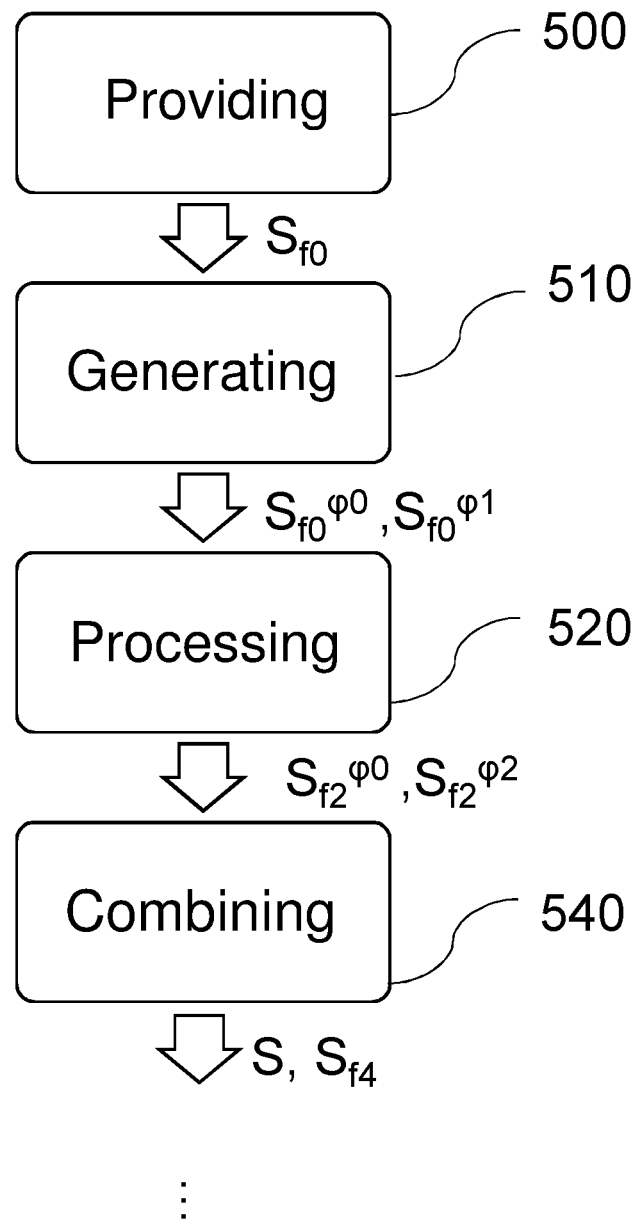
FIG. 5 is a diagram exemplary of a method according to the present disclosure.

FIG. 5 is an exemplary diagram of a signal processing method comprising:
providing 500 an input signal $S_{f0}$ having an input frequency value f0, e.g., provided by an oscillator 180, e.g., a voltage controlled oscillator (briefly, VCO),
generating 510 a set of out-of-phase signals $S_{f0}^{\varphi 0}$, $S_{f0}^{\varphi 1}$ comprising signals in quadrature therebetween, e.g., phase-shifted of 90°, for instance provided by a phase-shifter network 210,
processing 520 the set of out-of-phase signals $S_{f0}^{\varphi 0}$, $S_{f0}^{\varphi 1}$ and generating a set of rectified signals $S_{f2}^{\varphi 0}$, $S_{f2}^{\varphi 2}$ phase-shifted therebetween having a second frequency value f2 twice the input frequency value f0; for instance, generating the set of rectified signals may comprise employing a set of frequency doubler arrangements 220a, 220a comprising the frequency doubler arrangement 220,
combining 540 the set of rectified signals $S_{f2}^{\varphi 0}$, $S_{f2}^{\varphi 2}$ at a common node S, and generating a combination signal S having harmonic signal $S_{f4}$ at a third frequency value f4, e.g., fourfold the input frequency value f0.

In one or more embodiments, processing 540 the rectified set of out-of-phase signals $S_{f2}^{\varphi 0}$, $S_{f2}^{\varphi 2}$ may comprise adding the signals and optionally filtering a DC component from a sum signal $S_{f4}$, e.g., via the circuit 240.

In one or more embodiments, generating 540 the signal $S_{f4}$ may be performed employing the processing circuitry 240, e.g., filtering the DC offset from the harmonic signal $S_{f4}$ via a capacitive element.

One or more embodiments may comprise "stacking" or "cascading" a set of circuit arrangements 200, in order to provide very high multiplication factors, e.g., in a customizable manner (indicated via continuation dots at the bottom of FIG. 5).

Figure 6:
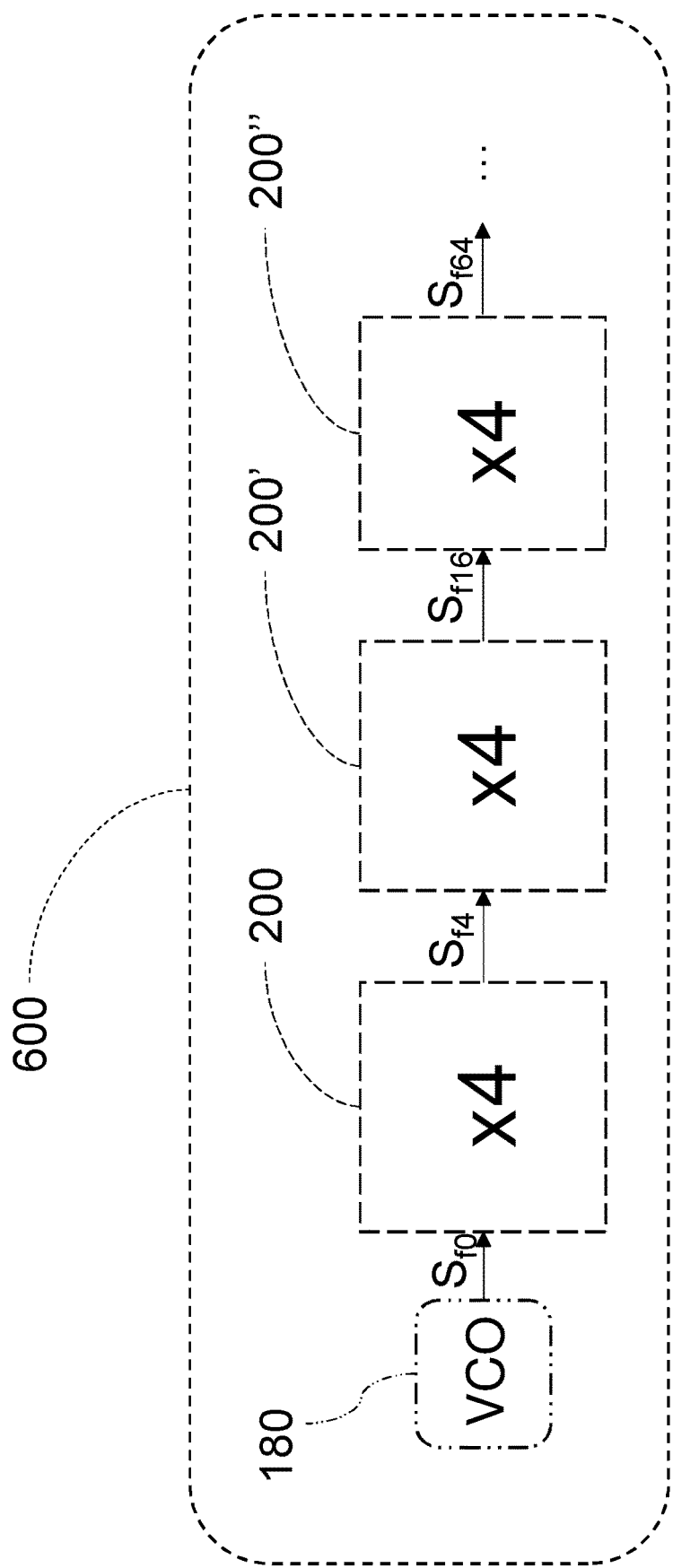
FIG. 6 is an exemplary diagram of a frequency arrangement according to the present disclosure.

In one or more embodiments, frequency multiplication may comprise a frequency multiplier arrangement comprising a stack or cascade 600 of frequency multipliers 200, 200', 200'', as exemplified in FIG. 6. For instance, for a cascade 600 having a plurality of stages:
an oscillator 180, e.g., a voltage controlled oscillator VCO, configured to generate an oscillating input signal $S_{f0}$,
a first frequency multiplier 200 that receives an input signal $S_{f0}$ and provides a first harmonic signal $S_{f4}$, having frequency N=4 times the input signal,
a second frequency multiplier 200', coupled to the first 200 and a third 200'', that receives the first multiplied signal $S_{f4}$ and provides a second multiplied signal $Sf_{16}$, having frequency N'=$4^2$ times the input signal $S_{f0}$,
the third frequency multiplier 200'', coupled to the second 200', that receives the second frequency multiplied signal $S_{f16}$ and provides as output a third frequency multiplied signal $S_{f64}$, having frequency N''=$4^3$ times the input signal, . . . and so on, until the last frequency multiplier in the stack, receives a (m−1)-th frequency multiplied signal and provides as output a m-th multiplied signal having frequency $N''=4^m$.

Figure 7:
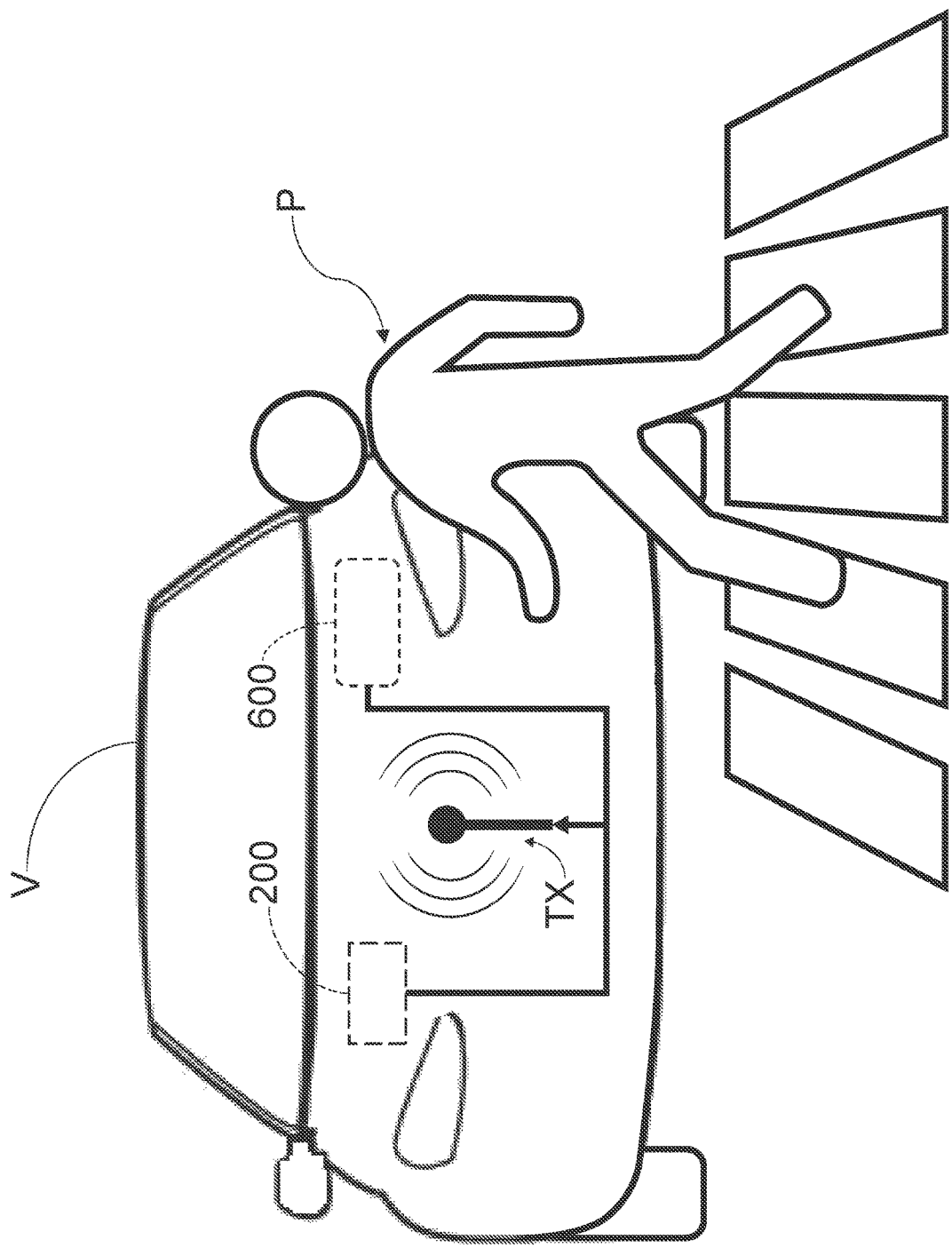
FIG. 7 is a diagram exemplary of a vehicle according to the present disclosure.

FIG. 7 is exemplary of one or more embodiments of a vehicle V, for instance a car comprising a driver assistance system, comprising the circuit 200 and/or the arrangement 600, an antenna TX, e.g., a transmission antenna of a mmW transceiver.

The circuit 200 or the frequency arrangement 600, as exemplified in FIG. 7, may advantageously facilitate a driver or the driver assistance system in the vehicle V in detecting the presence of a pedestrian P along a road, e.g. crossing the street, facilitating the increase of road safety.

One or more embodiments may comprise a circuit (for instance, 200), comprising:
an input port configured to receive an input signal (for instance, $S_{f0}$) having an input frequency, the input frequency having a first frequency value (for instance, f0),
a phase-shifter network (for instance, 210) coupled to the input port, the phase-shifter network configured to receive the input signal and to produce therefrom a first signal (for instance, $S_{f0}^{\varphi 0}$) and a second signal (for instance, $S_{f0}^{\varphi 1}$), the first signal and the second signal in quadrature there between,
frequency multiplier circuitry (for instance, 220a, 220b; 220) having a common node (for instance, S), the frequency multiplier circuitry comprising:
a) a first rectifier (for instance, 220a) coupled to the phase-shifter network, the first rectifier configured to rectify the first signal from the phase-shifter network and apply to the common node a first rectified signal (for instance, $S_{f2}^{\varphi 0}$) having a second frequency value (for instance, f2) twice the first frequency value (f0), and
b) a second rectifier (for instance, 220b) coupled to the phase-shifter network, the second rectifier configured to rectify the second signal from the phase-shifter network and apply to the common node a second rectified signal (for instance, $S_{f2}^{\varphi 2}$) having said second frequency value twice the first frequency value,
wherein a combination signal (for instance, S) of the first rectified signal and the second rectified signal is available at the common node, the combination signal including harmonic contents (for instance, $S_{f4}$) at a frequency value (for instance, f4) fourfold said first frequency value.

In one or more embodiments:
the phase-shifter network may be configured to produce each of said first signal and said second signal as a pair of signal replicas in anti-phase therebetween (for instance, $S_f^{\varphi}$, not($S_f^{\varphi}$)),
the first rectifier and the second rectifier in the frequency multiplier circuitry may comprise a first transistor (for instance, $Q_1$) and a second transistor (for instance, $Q_2$) having control terminals (for instance, B1, B2) configured to receive a respective one of said signal replicas in said pair of signal replicas in anti-phase therebetween; the first transistor and the second transistor having respective current paths therethrough arranged in parallel in a current line from a voltage supply node (for instance, V) to a load (for instance, $RF_L$) referred to ground (for instance, GND), with the common node coupled between said load and the parallel arrangement of the first transistor and the second transistor.

In one or more embodiments, the circuit may comprise a voltage controlled oscillator (for instance, 180) coupled to the input port and configured to generate said input signal having the first frequency value.

In one or more embodiments, the circuit may comprise a voltage controlled oscillator (for instance, 180) configured to generate said input signal with a first frequency value such that the frequency value fourfold said first frequency value lies in the millimeter wavelength range.

In one or more embodiments, the circuit may comprise decoupling circuitry (for instance, 240) coupled to the common node and configured to remove DC contents from said combination signal.

One or more embodiments may comprise a frequency multiplier arrangement (for instance, 600), comprising a cascaded arrangement (for instance, 200, 200', 200'') of a plurality of circuits according to one or more embodiments, wherein at least one of the circuits (for instance, 200') in the cascaded arrangement (for instance, 200, 200', 200'') has its input node (for instance, $S_{f16}$) coupled to the common node (for instance, $S_{f4}$) of another one of the circuits (for instance, 200) in the cascaded arrangement.

One or more embodiments may comprise a system, comprising:
a circuit according to one or more embodiments or a frequency multiplier arrangement according to one or more embodiments,
a transmitter antenna (for instance, TX) coupled to the common node of said circuit or the common node (for instance, $S_{f4}$, $S_{f16}$, $S_{f64}$) of said another one of the circuits in the cascaded arrangement.

In one or more embodiments the system may comprise a vehicular radar sensor system.

One or more embodiments may comprise a vehicle (for instance, V) equipped with a vehicular radar sensor system according to one or more embodiments.

One or more embodiments may comprise a method, which may comprise:
receiving (for instance, 500) an input signal (for instance, $S_{f0}$) having an input frequency, the input frequency having a first frequency value,
applying (for instance, 510) phase-shift processing to the input signal and producing therefrom a first signal (for instance, $S_{f0}^{\varphi 0}$) and a second signal (for instance, $S_{f0}^{\varphi 1}$), the first signal and the second signal (for instance, $S_{f0}^{\varphi 1}$) in quadrature therebetween,
a) rectifying (for instance, 520) the first signal to generate therefrom a first rectified signal (for instance, $S_{f2}^{\varphi 0}$) having a second frequency value twice the first frequency value,
b) rectifying (for instance, 520) the second signal to generate therefrom a second rectified signal (for instance, $S_{f2}^{\varphi 2}$) having said second frequency value twice the first frequency value,
applying (for instance, 540) said first rectified signal and said second rectified signal to a common node wherein a combination signal (for instance, S) of the first rectified signal and the second rectified signal is available at the common node, the combination signal (for instance, S) including harmonic contents (for instance, $S_{f4}$) at a frequency value fourfold said first frequency value.

In one or more embodiments, the method may comprise removing DC contents from said combination signal.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection. The extent of protection is defined by the annexed claims.

The invention claimed is:

1. A circuit, comprising:
an input port configured to receive an input signal having an input frequency, the input frequency having a first frequency value;
a phase-shifter network having an input coupled to the input port to receive the input signal and to generate therefrom a first signal and a second signal, the first signal and the second signal being in quadrature with one another; and
frequency multiplier circuitry having a common node, the frequency multiplier circuitry comprising:
a) a first rectifier having an input coupled to a first output of the phase-shifter network to receive and rectify the first signal and to generate a first rectified signal for application to the common node, the first rectified signal having a second frequency value that is twice the first frequency value; and
b) a second rectifier having an input coupled to a second output of the phase-shifter network to receive and rectify the second signal and to generate a second rectified signal for application to the common node, the second rectified signal having said second frequency value;
wherein the common node outputs a combination signal that is a combination of the first rectified signal and the second rectified signal, the combination signal including harmonic contents at a frequency value that is fourfold said first frequency value.

2. The circuit of claim 1, wherein:
the phase-shifter network is configured to produce each of said first signal and said second signal as a pair of signal replicas in anti-phase to one another; and
the first rectifier and the second rectifier in the frequency multiplier circuitry comprise a first transistor and a second transistor having control terminals configured to receive respective ones of said signal replicas of said pair of signal replicas, the first transistor and the second transistor having respective current paths therethrough arranged in parallel in a current line from a voltage supply node to a load referred to ground, with the common node coupled between said load and the parallel arrangement of the first transistor and the second transistor.

3. The circuit of claim 1, further comprising a voltage controlled oscillator coupled to the input port and configured to generate said input signal having the first frequency value.

4. The circuit of claim 1, further comprising a voltage controlled oscillator configured to generate said input signal with the first frequency value such that the frequency value that is fourfold said first frequency value lies in a millimeter wavelength range.

5. The circuit of claim 1, further comprising decoupling circuitry coupled to the common node and configured to remove DC contents from said combination signal.

6. The circuit of claim 1, further comprising a transmitter antenna coupled to the common node.

7. An apparatus including a frequency multiplier arrangement, comprising:
a cascaded arrangement of a plurality of circuits, each circuit of the plurality of circuits comprising:
an input port configured to receive an input signal having an input frequency, the input frequency having a first frequency value;
a phase-shifter network having an input coupled to the input port to receive the input signal and to generate therefrom a first signal and a second signal, the first signal and the second signal being in quadrature with one another; and
frequency multiplier circuitry having a common node, the frequency multiplier circuitry comprising:
a) a first rectifier having an input coupled to a first output of the phase-shifter network to receive and rectify the first signal and to generate a first rectified signal for application to the common node, the first rectified signal having a second frequency value that is twice the first frequency value; and
b) a second rectifier having an input coupled to a second output of the phase-shifter network to receive and rectify the second signal and to generate a second rectified signal for application to the common node, the second rectified signal having said second frequency value;
wherein the common node outputs a combination signal that is a combination of the first rectified signal and the second rectified signal, the combination signal including harmonic contents at a frequency value that is fourfold said first frequency value.

8. The apparatus of claim 7, wherein:
the phase-shifter network is configured to produce each of said first signal and said second signal as a pair of signal replicas in anti-phase to one another; and
the first rectifier and the second rectifier in the frequency multiplier circuitry comprise a first transistor and a second transistor having control terminals configured to receive respective ones of said signal replicas of said pair of signal replicas, the first transistor and the second transistor having respective current paths therethrough arranged in parallel in a current line from a voltage supply node to a load referred to ground, with the common node coupled between said load and the parallel arrangement of the first transistor and the second transistor.

9. The apparatus of claim 7, further comprising a voltage controlled oscillator coupled to the input port and configured to generate said input signal having the first frequency value.

10. The apparatus of claim 7, further comprising a voltage controlled oscillator configured to generate said input signal with a first frequency value such that the frequency value that is fourfold said first frequency value lies in a millimeter wavelength range.

11. The apparatus of claim 7, further comprising decoupling circuitry coupled to the common node and configured to remove DC contents from said combination signal.

12. The apparatus of claim 7, further comprising a transmitter antenna coupled to another one of the plurality of circuits in the cascaded arrangement.

13. The apparatus of claim 7, wherein the apparatus is a component of a vehicular radar sensor system.

14. The apparatus of claim 13, further comprising a transmitter antenna coupled to the common node.

15. The apparatus of claim 13, wherein the apparatus comprises a vehicle equipped with the vehicular radar sensor system.

16. A method, comprising:
- receiving an input signal having an input frequency, the input frequency having a first frequency value;
- applying phase-shift processing to the input signal to produce therefrom a first signal and a second signal, the first signal and the second signal being in quadrature with one another;
- rectifying the first signal to generate therefrom a first rectified signal having a second frequency value that is twice the first frequency value;
- rectifying the second signal to generate therefrom a second rectified signal having said second frequency value; and
- applying said first rectified signal and said second rectified signal to a common node, wherein a combination signal comprised of the first rectified signal and the second rectified signal is available at the common node, the combination signal including harmonic contents at a frequency value that is fourfold said first frequency value.

17. The method of claim 16, further comprising removing DC contents from said combination signal.

* * * * *